US012368294B2

(12) United States Patent
Singh et al.

(10) Patent No.: US 12,368,294 B2
(45) Date of Patent: Jul. 22, 2025

(54) FREQUENCY-DEPENDENT GROUND FAULT CIRCUIT INTERRUPTER

(71) Applicant: SEMICONDUCTOR COMPONENTS INDUSTRIES, LLC, Scottsdale, AZ (US)

(72) Inventors: Rishi Pratap Singh, Plano, TX (US); Colton Jensen, Pocatello, ID (US); Yixin Song, Plano, TX (US); Seunghan Back, Allen, TX (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 205 days.

(21) Appl. No.: 18/450,224

(22) Filed: Aug. 15, 2023

(65) Prior Publication Data

US 2024/0097429 A1    Mar. 21, 2024

Related U.S. Application Data

(60) Provisional application No. 63/374,990, filed on Sep. 8, 2022.

(51) Int. Cl.
*H02H 3/16* (2006.01)
(52) U.S. Cl.
CPC ..................... *H02H 3/16* (2013.01)
(58) Field of Classification Search
CPC ....................................................... H02H 3/16
See application file for complete search history.

(56) References Cited

U.S. PATENT DOCUMENTS

| 6,747,856 | B1 | 6/2004 | Huber et al. |
| 7,636,224 | B2 | 12/2009 | Zandonella Balco |
| 8,908,338 | B2 | 12/2014 | Kinsel |
| 8,908,339 | B2 | 12/2014 | Kinsel |
| 11,411,388 | B2 | 8/2022 | Singh et al. |
| 2006/0274462 | A1 | 12/2006 | Chan et al. |
| 2008/0036466 | A1 | 2/2008 | Raber |

(Continued)

OTHER PUBLICATIONS

Onsemi, Self-Test Appliance Leakage Circuit Interrupter (CLCI), NCS37020 Data Sheet, Sep. 2022, Rev. 3,13 pages.

(Continued)

*Primary Examiner* — Scott Bauer
(74) *Attorney, Agent, or Firm* — Ramey LLP (57) ABSTRACT

Illustrative GFCI devices and methods maintain safety while reducing the risk of unnecessary interruptions. One illustrative GFCI circuit includes: a first operational amplifier configured to couple to a first current transformer that senses a net current through multiple power conductors, the first operational amplifier configured to convert a signal current from a signal terminal of the first current transformer to a signal voltage, the signal voltage having an inverse dependence on frequency; an analog to digital converter configured to provide samples of the signal voltage; and a controller configured to interrupt at least one of the multiple power conductors when an magnitude measurement derived from the samples exceeds a frequency-independent and/or phase-independent threshold a predetermined number of times or for a predetermined time period.

19 Claims, 5 Drawing Sheets

(56) References Cited

U.S. PATENT DOCUMENTS

| | | | | |
|---|---|---|---|---|
| 2009/0315731 A1* | 12/2009 | Meisel | ................. | H02H 3/04 |
| | | | | 340/638 |
| 2010/0309592 A1* | 12/2010 | Kinsel | ................. | H02H 3/331 |
| | | | | 361/50 |
| 2014/0159704 A1* | 6/2014 | Rathsmann | ......... | G01R 15/185 |
| | | | | 324/117 R |
| 2019/0356127 A1 | 11/2019 | Ostrovsky et al. | | |
| 2021/0035764 A1 | 2/2021 | Yoon et al. | | |
| 2021/0096192 A1* | 4/2021 | Haines | ................. | H02H 3/33 |

OTHER PUBLICATIONS

Search Report for counterpart DE application No. 102023124042.0, mailed May 15, 2024, 5 pages.

* cited by examiner

FREQUENCY-DEPENDENT GROUND FAULT CIRCUIT INTERRUPTER

CROSS-REFERENCE TO RELATED APPLICATIONS

The present application claims priority to Provisional U.S. Application 63/374,990, filed 2022 Sep. 8 and titled "Ground Fault Circuit Interrupter with Scalable Threshold over a Range of Frequencies" by inventors R. Singh, C. Jensen, Y. Song, and S. Back. The foregoing application is hereby incorporated herein by reference in its entirety.

BACKGROUND

Ground fault circuit interrupters (GFCI) are widely used in commercial and residential locations with various types of electrical systems and power cords to protect people from severe electrical shocks. GFCI devices achieve protection by disconnecting the circuit when an unsafe level of current leakage is detected. However, such safety mechanisms must balance the need for safety with the risk of overprotection. If a GFCI device persistently disconnects a circuit unnecessarily, users will regard it as a nuisance to be circumvented or removed, thereby defeating the purpose of having such a device.

SUMMARY

Accordingly, there are disclosed herein illustrative GFCI devices and methods that maintain safety while reducing the risk of unnecessary interruptions. One illustrative GFCI circuit includes: a current to voltage converter configured to receive a signal current from a first current transformer that senses a net current through multiple power conductors, the current-to-voltage converter configured to convert a signal current to a signal voltage, the signal voltage having a magnitude that decreases with increasing frequency; an analog to digital converter configured to provide samples of the signal voltage; and a controller configured to interrupt at least one of the multiple power conductors when an magnitude measurement derived from the samples exceeds a frequency-independent and/or phase-independent threshold for a predetermined time period or for a predetermined number of times.

An illustrative method includes: receiving a signal current from a first current transformer configured to sense a net current through multiple power conductors; converting the signal current into a frequency-dependent signal voltage, the frequency-dependent signal voltage being smaller for higher frequencies than for lower frequencies; deriving an magnitude measurement from the signal voltage; and interrupting at least one of the power conductors when the magnitude measurement exceeds a frequency-independent and/or phase-independent threshold for a predetermined time interval or a predetermined number of times.

Another illustrative circuit includes: an operational amplifier having an inverting input coupled to a current transformer configured to sense a net current through multiple power conductors, the operational amplifier having an output coupled to the inverting input via a feedback impedance that decreases with frequency; a comparator configured to produce a comparator signal indicating when the output of the operational amplifier exceeds a frequency-independent value; a controller configured to measure a percentage of time that the comparator signal is asserted, the percentage measurement representing a magnitude of the output of the operational amplifier, the controller further configured to assert an interrupt signal when the percentage measurement indicates a ground fault; and a relay configured to interrupt at least one of the multiple power conductors when the interrupt signal is asserted.

Each of the foregoing examples can be employed individually or in conjunction and may include one or more of the following features in any suitable combination: 1. the signal voltage can be represented as $$v = i\left(\frac{a}{b+f}\right)$$

where a and b are positive constants, f is frequency, and i is the signal current. 2. b has a value of about 1754.5. 3. the magnitude measurement is based on a percentage of time that the samples (or the samples' absolute values) exceed a baseline value. 4. as part of interrupting the at least one of the multiple power conductors, the controller is configured to provide a pre-interrupt delay that depends on the magnitude measurement. 5. the current-to-voltage converter is a first operational amplifier. 6. a second operational amplifier configured to couple to a bias terminal of the first current transformer and configured to minimize a DC voltage difference between the bias terminal and the signal terminal to keep the CT offset in check. 7. the second operational amplifier is configured as a chopper amplifier. 8. a third operational amplifier configured to couple to a second current transformer to induce an opposing current with respect to the first current transformer. 9. the controller is configured to enable the third operational amplifier to test for a ground neutral fault when a signal voltage frequency is within a predetermined range. 10. the controller is configured to test for a ground neutral fault using a third operational amplifier configured to couple to a second current transformer to induce an opposing current relative to the first current transformer which will produce an oscillating signal at the output of the third operational amplifier. 11. the controller is configured to interrupt at least one of the multiple power conductors if the oscillating signal has a frequency within a predetermined range, e.g., about 2 kHz to about 7 kHz.

DETAILED DESCRIPTION

The following description and accompanying drawings are provided for explanatory purposes, not to limit the disclosure. To the contrary, they provide the foundation for one of ordinary skill in the art to understand all modifications, equivalents, and alternatives falling within the scope of the claims.

Figure 1:
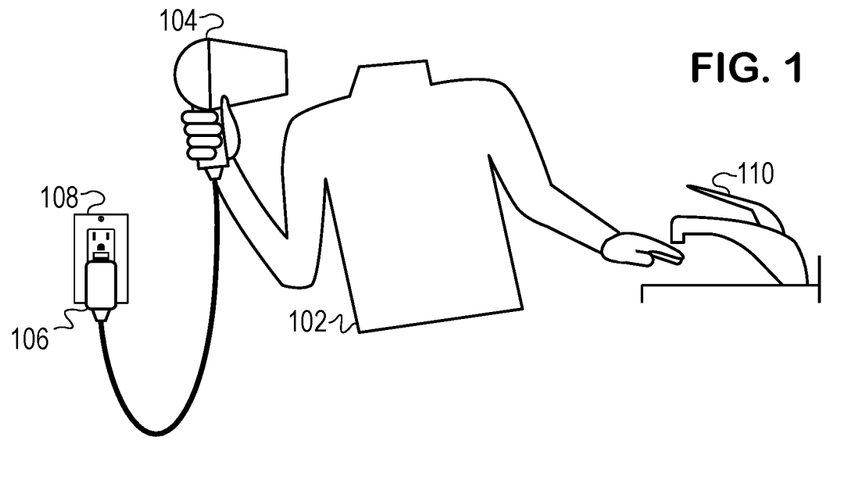
FIG. 1 is a schematic view of an illustrative GFCI usage context.

Conventional GFCIs are designed to detect and protect against ground faults at the AC mains frequency (typically 50 or 60 Hz). With the increasing importance of energy efficiency, many appliances are equipped with switching mode power supplies or other components that generate high frequency signals. At the higher frequencies involved (e.g., 10 kHz or more), these signals can capacitively couple to ground, causing a leakage current in excess of a conventional GFCI's safety threshold (typically between 4 and 6 mA root mean square current) and unnecessarily tripping the device. Even when coupled to ground via a human body, such high frequency signals pose a reduced risk of electrocution and can be tolerated at higher current levels than a mains frequency signal. Accordingly, a GFCI device that suitably incorporates a frequency dependence can maintain safety while reducing the risk of unnecessary triggering. FIG. 1 provides an illustrative usage context in which a user having torso 102 holds an electrical appliance 104 (shown in FIG. 1 as a hair dryer) having a plug 106 connected to an electrical outlet 108. The outlet 108 and/or the plug 106 may each contain a GFCI device to disconnect power from the appliance 104 if the user creates a current leakage path by contacting a local ground connection such as a metal faucet 110 or stream of water. (Typically, the appliance 104 is insulated to prevent leakage path formation, but the insulative coating may be cracked or there may be water intrusion into the appliance facilitating conduction between the user and the electrical wiring.) Though the term ground fault circuit interrupter (GFCI) is used herein, these devices are also known by other names including ground fault interrupter (GFI), appliance leakage circuit interrupter (ALCI), residual current device (RCD), residual current circuit breaker (RCCB), portable residual current device (PRCD), earth leakage current detector (ELCD), and charging circuit interrupting device (CCID).

Figure 2:
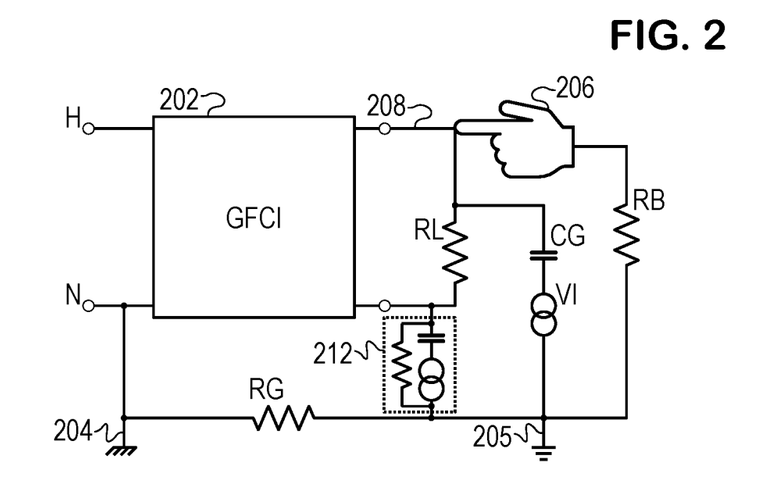
FIG. 2 is a circuit schematic of an illustrative usage model.

The context may be modeled using the circuit schematic shown in FIG. 2. The GFCI device 202 is coupled between hot (H) and neutral (N) line power conductors and hot and neutral conductors for the appliance, which is represented by the load resistance $R_L$. The neutral line N is indirectly coupled to a remote ground or "earth" connection 204, which is in turn coupled to a local ground point 205 (such as the household plumbing). Typically, a small ground resistance R G (typically a few ohms to a few hundred ohms) exists between the local ground point 205 and the earth connection 204. As described previously, a user 206 may inadvertently create a current leakage path (represented by body resistance $R_B$) between the appliance's hot power conductor 208 and the local ground point 205. If the current through the current leakage path exceeds a safe level, say about 5 mA RMS at 60 Hz, the GFCI device 202 disconnects at least one, and preferably both, of the line power conductors from the appliance's power conductors to interrupt the current before the user is harmed.

In addition to the potentially harmful leakage current, there may be harmless leakage currents, e.g., currents due to high frequency signals capacitively coupling to ground. Such signals are becoming more common with the increasing popularity of switching mode power supplies in energy-efficient home appliances. In FIG. 2, such currents are represented by an interference voltage $V_I$ in series with a ground capacitance $C_G$ coupled between the local ground point 205 and the appliance's hot conductor 208. Though harmless, such signals can create a nuisance by unnecessarily tripping GFCI devices.

The above ground fault currents are not the only types of leakage current that may exist. There may also exist a "ground neutral" fault 212 in which the appliance's neutral conductor is given a voltage that is potentially dangerous to the user, but which may not create a detectable difference in the currents carried by the appliance's hot and neutral conductors. Such faults are typically the result of improper installation of the electrical outlet and may require extra detection efforts.

Figure 3:
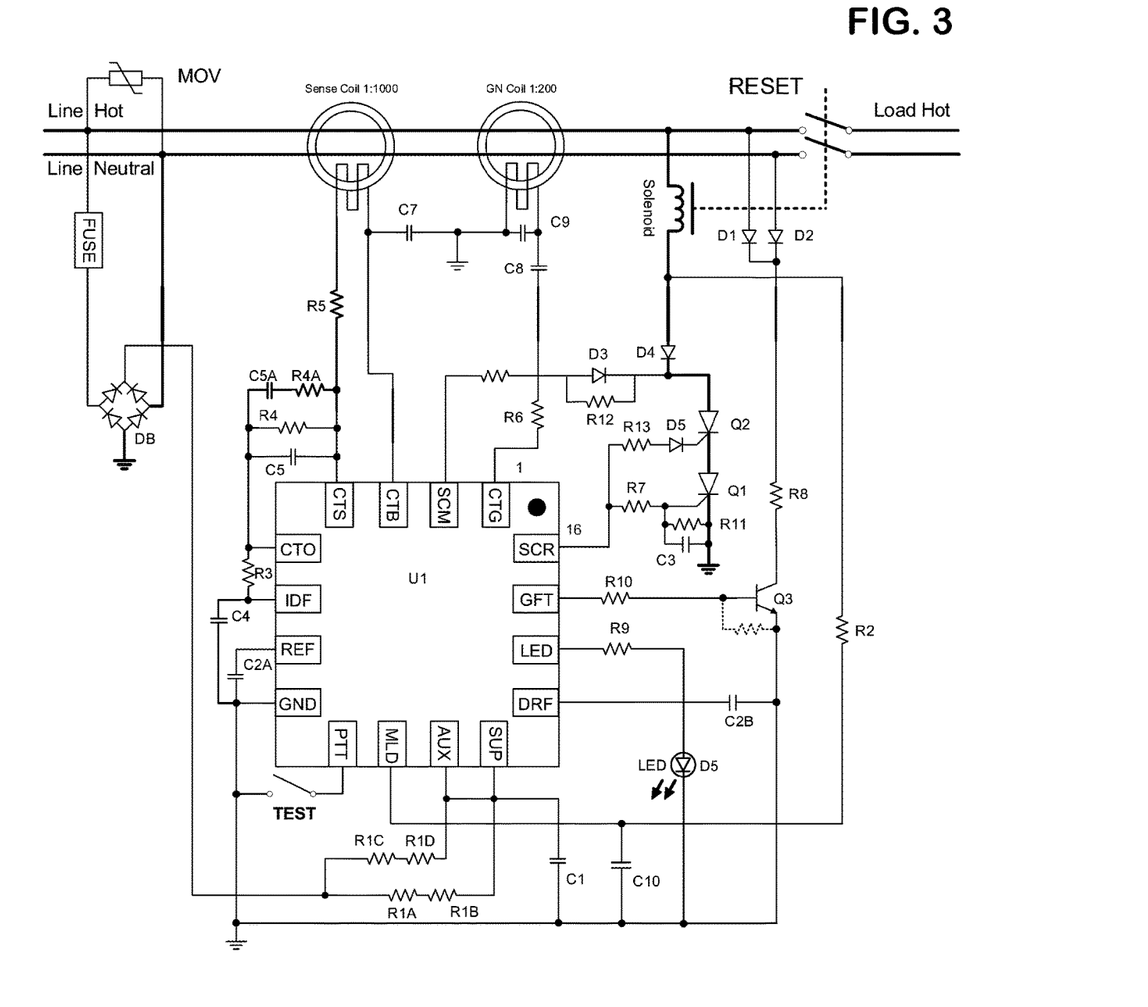
FIG. 3. is a complete circuit schematic of an illustrative GFCI device.

FIG. 3 is a schematic of an illustrative GFCI device 202. For potentially damaging transient voltages, a metal oxide varistor (MOV) shields the GFCI circuitry by providing a short circuit path between Line Hot and Line Neutral conductors. A solenoid controls a double-pole single-throw (DPST) relay that couples the Line Hot conductor to the Load Hot conductor 208 and the Line Neutral conductor to the Load Neutral conductor until the relay is triggered, at which point the Load Hot and Load Neutral conductors are disconnected (i.e., interrupted). A Reset switch resets the relay after it has been triggered.

A diode bridge (DB) provides full-wave rectification of the AC power signal, coupling whichever of the Line Hot and Line Neutral conductors is at higher voltage to the power supply (SUP) and/or auxiliary power (AUX) pins of controller chip U1 via resistances R1A-R1D, and coupling whichever of the conductors is at lower voltage to the ground (GND) pin. A capacitance Cl between the power (SUP/AUX) and ground (GND) pins smooths the rectified power signal into an essentially DC power signal.

A Test switch (TEST) couples a push-to-test (PTT) pin of chip U1 to ground, causing the chip U1 to assert the ground fault test (GFT) pin. The ground fault test pin is coupled via a resistance R10 to the base of a bipolar NPN transistor Q3. Diodes D1 and D2 respectively couple the Line Hot conductor and the Line Neutral conductor via a resistance R8 to transistor Q3's collector, and the emitter is coupled to ground. When the ground fault test pin is asserted, transistor Q3 conducts, forming a leakage current path from the higher voltage of the Line Hot and Line Neutral conductors to the lower voltage one enabling the chip U1 to test whether a leakage current path is properly detected. When a current imbalance or other fault is detected, or when performing self-testing, the controller chip U1 asserts the silicon-controlled rectifier (SCR) pin, driving thyristor Q1 via resistance R7 and thyristor Q2 via resistance R13 and diode D5 into conduction mode, drawing current through the solenoid via diode D4 and causing the relay to decouple the Load Hot and Load Neutral from the Line Hot and Line Neutral. Resistance R11 and capacitance C3 are coupled between the gate and cathode of Q1, forming a low pass filter to protect against accidental triggering of the thyristors. An SCR monitor (SCM) pin is coupled via diode D3 and resistance R12 to the anode of thyristor Q2, enabling controller chip U1 to verify that the thyristors operate correctly when triggered.

A light-emitting diode (LED) pin may be coupled via a resistance R9 to an LED diode D5 to enable the controller chip U1 to provide a status signal to the user. Capacitors C2A and C2B may be coupled between the chip's ground and reference voltage (REF) and digital reference voltage (DRF) pins, respectively, to aid with regulation of these internal reference voltages. A mains level detector (MLD) pin may be coupled to ground via a capacitance C10 and coupled via a resistance R2 to the control terminal of the solenoid (and thus be indirectly coupled to the Line Hot conductor). The capacitance, resistance, and solenoid inductance provide a smoothed measurement of the AC line voltage, enabling the controller chip U1 to detect over- or under-voltages on Line Hot conductor.

The illustrative GFCI device 202 also includes a sense coil (possibly wound on a permalloy or ferrite core) that surrounds multiple power conductors to act as a first current transformer, and a ground neutral oscillation (GN) coil surrounding the multiple power conductors to act as a second current transformer. In this case the multiple power conductors are the Line Hot and Line Neutral conductors, but in other cases they could include three phase power conductors with or without a Line Neutral conductor. So long as the current through the multiple power conductors balances out, the net current (the sum of currents through the conductors) is zero and no signal current is induced in the sense coil. If, however, a current leakage path is formed, the currents through the conductors enclosed by the sense coil will not sum to zero and a detectable sense current is induced in the sense coil. The sense coil has a bias terminal coupled to a current transformer bias (CTB) pin of controller chip U1 and coupled via a capacitance C7 to ground. The signal terminal of the sense coil is coupled via a resistance R5 to a current transformer signal (CTS) pin of the controller chip.

As will be discussed further below, a current transformer output (CTO) pin is coupled to the CTS pin via a feedback impedance formed by a resistance R4 in parallel with a capacitance C5 and in parallel with a circuit path having a resistance R4A in series with a capacitance C5A. The CTO pin may also be coupled via a resistance R3 to differential lowpass filter (IDF) pin, which in turn is coupled via capacitance C4 to ground. Resistance R3 and capacitance C4 form a low pass filter that may provide a filtered output signal to the IDF pin for use as described further below.

The GN coil has a ground terminal coupled to ground and a signal terminal coupled via a serial capacitance C8 and resistance R6 to a GN current transformer signal (CTG) pin. The GN coil's terminals may be coupled by a capacitance C8 to reduce high frequency electromagnetic interference. The GN coil can be used to induce a current signal in the multiple power conductors to enable detection of a ground neutral fault as discussed further below.

Figure 4:
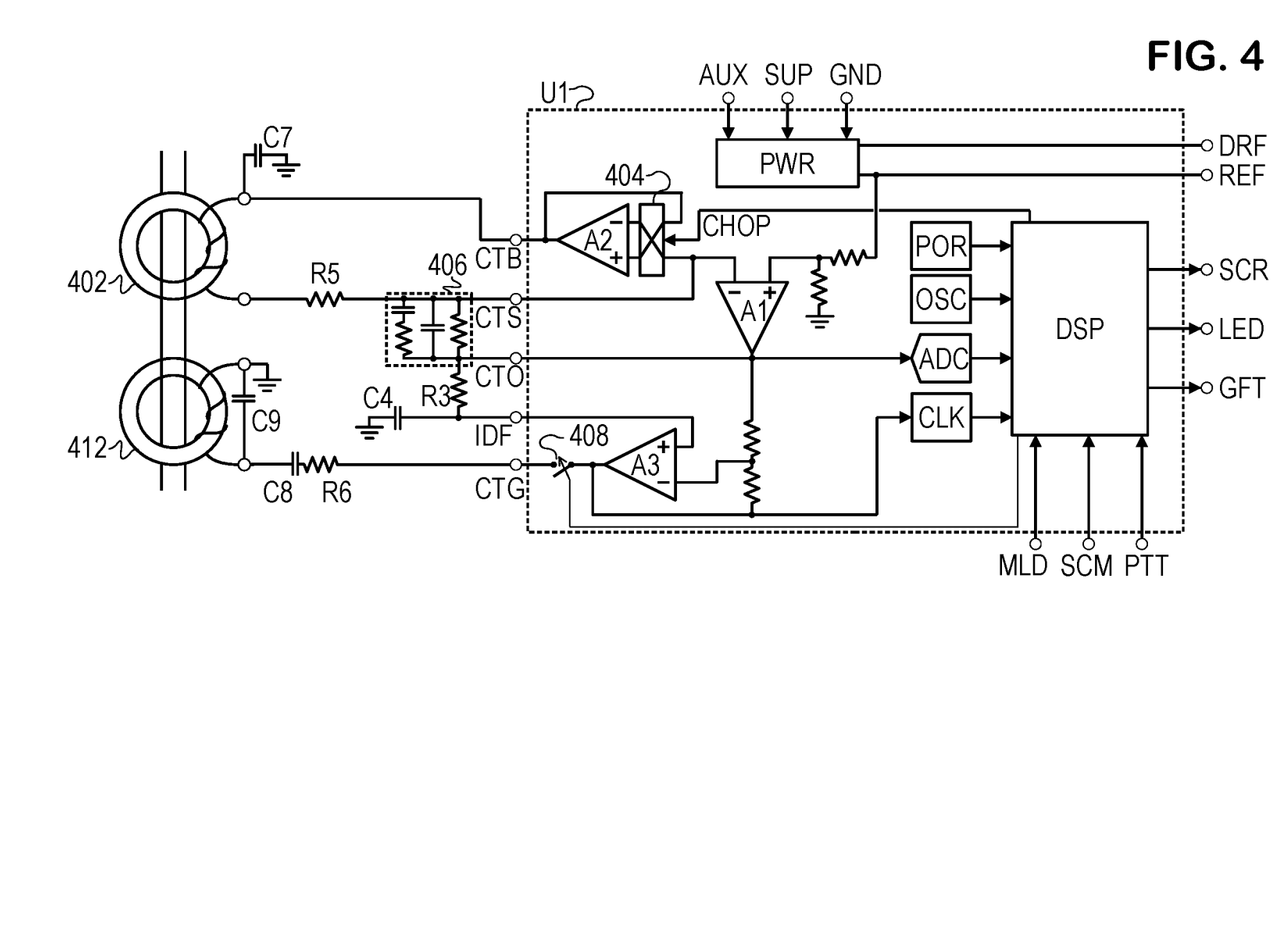
FIG. 4 is circuit schematic of a first illustrative sensing portion.

FIG. 4 is a circuit schematic detailing the sensing portion of an illustrative controller chip U1. The power supply circuit (PWR) conditions and regulates power for the rest of the circuitry and may further include a bandgap reference to supply a reference voltage (REF). A Power-on-reset (POR) circuit may initialize the various registers and set the digital signal processor or other core logic (DSP) in a known initial state when power is restored to the chip U1. The DSP may be a programmable controller or processor configured with appropriate firmware or it may be application-specific integrated circuitry that implements the functionality described herein. In either case, the functionality may optionally be implemented using registers or other memory elements to track state information for a state machine. An on-chip oscillator (OSC) may be included to provide a clock signal for the DSP and any other digital components such as the analog to digital converter (ADC).

Current transformer 402 has a sensing coil with its bias terminal coupled to the CTB pin and a capacitance C7 that may act as an integrator when driven by an amplifier A2. A switch arrangement 404 opens and closes in accordance with a chopping signal from the DSP, causing amplifier A2 to operate as a chopper amplifier. Chopper amplifiers are known for their minimization of DC offset and immunity to drift of device parameters, features that enhance the accuracy of sensing amplifier A1. The chopper amplifier's direct feedback path causes the voltage of the bias pin CTB to minimize any DC voltage difference relative to the inverting input of sensing amplifier A1, which through a separate path provided by feedback impedance 406, matches the fixed voltage at the sensing amplifier's noninverting input. Because any voltage offset between the CTB and CTS pins is minimized, any current detected at input of the sensing amplifier A1 may be attributed entirely to the sensing coil, minus any current received via the feedback impedance 406.

As is well understood for the operation of suitably configured operational amplifiers (i.e., high-gain differential amplifiers), the sensing amplifier A1 produces a signal voltage that eliminates any voltage difference between the inverting and non-inverting inputs. Thus, the sensing amplifier's output signal voltage is $V_{CTO}=V_{CTS}-I_{CT}*Z_{FB}$, where $Z_{FB}$ is the complex value of the feedback impedance 406, $I_{CT}$ is the current from the sensing coil, and $V_{CTS}$ is the voltage of the sensing terminal (which equals the fixed voltage of the amplifier's noninverting input). Thus, amplifier A1 operates as a current-to-voltage converter, and the output signal voltage is coupled to the input of an analog to digital converter (ADC). Other suitable current-to-voltage converters are known and may be suitable.

To reiterate, the current-to-voltage converter may be an operational amplifier A1, and operational amplifier A2 may be configured to couple to a bias terminal of the first current transformer 402 and configured to eliminate any DC voltage difference between the bias terminal and a signal terminal of the first current transformer 402.

The ADC may be of the successive approximation register (SAR) type, which may offer minimal complexity and cost, or it may be of any other suitable type. The ADC is clocked at a rate sufficient to enable detection of leakage currents across a desired range of frequencies, e.g., for a range from 50 Hz to 150 kHz, the ADC may be clocked at a rate of, say, 3 MHz.

The DSP may monitor the digitized signal for potential fault conditions as described further below and, in combination with the MLD, SCM, and PTT pin inputs, may responsively drive the SCR, GFT, and LED pin outputs. More specifically, upon detecting a Ground Fault condition, the DSP may momentarily assert the SCR pin, causing the solenoid to disconnect the Load Hot and Load Neutral conductors from the Line Hot and Line Neutral conductors. In at least some implementations, the conductors may remain disconnected until the solenoid is physically pushed back into its initial position by the Reset switch.

In some implementations, the DSP may perform ground fault detection with a repeated comparison of the digitized signal voltage to a threshold value representing e.g., 30 mA, disconnecting within 25 ms if the threshold is exceeded a predetermined number of times or for a predetermined period of time (e.g., 3 ms). However, some contemplated implementations may permit a longer pre-interrupt delay for reduced RMS threshold values. Stated in another way, before interrupting one or more of the power conductors, the DSP may provide a pre-interrupt delay that depends on the magnitude measurement.

To detect Ground Neutral Fault conditions (as opposed to Ground Fault conditions), the illustrative controller chip U1 may employ a second current transformer 412. To detect such conditions, the DSP is configured to momentarily close switch 408 or otherwise enable amplifier A3 to drive the second current transformer 412 to induce a current in the multiple power conductors detectable by the first current transformer 402 as an opposing current. The current to voltage converter (amplifier A1) converts the current to a signal voltage. Resistors couple the inverting input of amplifier A3 to the output of amplifiers A1 and A3, completing a feedback loop that acts as an oscillator while switch 408 is closed. The output of amplifier A3 is also coupled to a comparator, hereafter termed a "clock" (CLK), which converts the oscillation signal into a digital clock signal for the DSP. If a detectable oscillation is created by the feedback loop, the DSP may diagnose a Ground Neutral Fault and determine that the load conductors should be disconnected. Alternatively, the DSP may diagnose a Ground Neutral Fault if the clock signal has a frequency in a predetermined range, e.g., about 2 kHz to about 10 kHz, and accordingly interrupt at least one of the multiple power conductors.

The disclosed threshold and delay parameters are meant for use at the mains frequency, i.e., 50 or 60 Hz. As discussed previously, current leakages at higher frequencies may be less hazardous, and accordingly, the GFCI device may be configured to permit higher leakage currents at such frequencies. To this end, the feedback impedance 406 may be designed to attenuate higher frequencies, causing the output voltage of sensing amplifier A1 to be lower for higher frequency currents than for low frequency currents, or stated in another fashion, the output signal voltage has a magnitude that decreases as frequency increases. If the DSP uses a frequency-independent threshold (i.e., a constant value that does not depend on frequency), such a feedback impedance permits higher frequency leakage currents to have higher magnitudes. Stated in another fashion, the feedback impedance decreases with frequency, thereby attenuating higher frequencies and reducing sensitivity of the GFCI device to higher frequency leakage currents.

The DSP can of course directly measure the maximum magnitude of the digitized signal within a moving window, but such a measurement may be undesirably noisy. As an alternative way to obtain the magnitude measurement, the DSP can track the percentage of time that the digitized signal samples exceed a baseline value. Assuming that the leakage current C is sinusoidal, it can be expressed:

$$C = a * \sin(2\pi f t)$$

where a is the amplitude, f is the frequency, and t is time. Assume that the current C crosses the threshold value at a given time $t_T$. From t=0 to t=$t_T$, the current's magnitude is below the threshold value, and from t=$t_T$ to t=¼f, the current's magnitude is above the threshold value. (Due to symmetry, the percentage of time the threshold is exceeded during the first quarter wave is representative of the entire waveform.) Accordingly, the percentage p can be expressed $$p = \frac{\frac{1}{4f} - t_T}{\frac{1}{4f}} * 100\% = (1 - 4ft_T) * 100\%.$$

This percentage measurement is expected to be a robust measurement of the signal's magnitude. Taking, for example, an RMS threshold of 5 mA (corresponding to an amplitude a=√2*5 mA), the leakage current C exceeds a threshold corresponding to 5 mA at $t_T$=⅛f. Substituting this value into the percentage equation, we get p=50%. Notably, this percentage is independent of the signal frequency (and independent of the AC line frequency), and the DSP may detect the existence of a fault based on the percentage of time p that the signal exceeds the threshold value. (Note that the threshold value may account for various scale factors including the turn ratio of the current transformer, the gain of the sensing amplifier A1 with the chosen feedback impedance, and any gain implemented within the ADC.) The DSP logic includes a comparator to compare the signal to the RMS threshold to obtain the percentage measurement and a comparator to determine whether the percentage measurement exceeds 50%. This approach may advantageously enable the DSP to carry out its comparisons for the measurement and fault detection operations in a phase-independent and frequency-independent manner, i.e., without needing to explicitly account for the phase and frequency of the power signal or the leakage current sensing signal.

Figure 5:
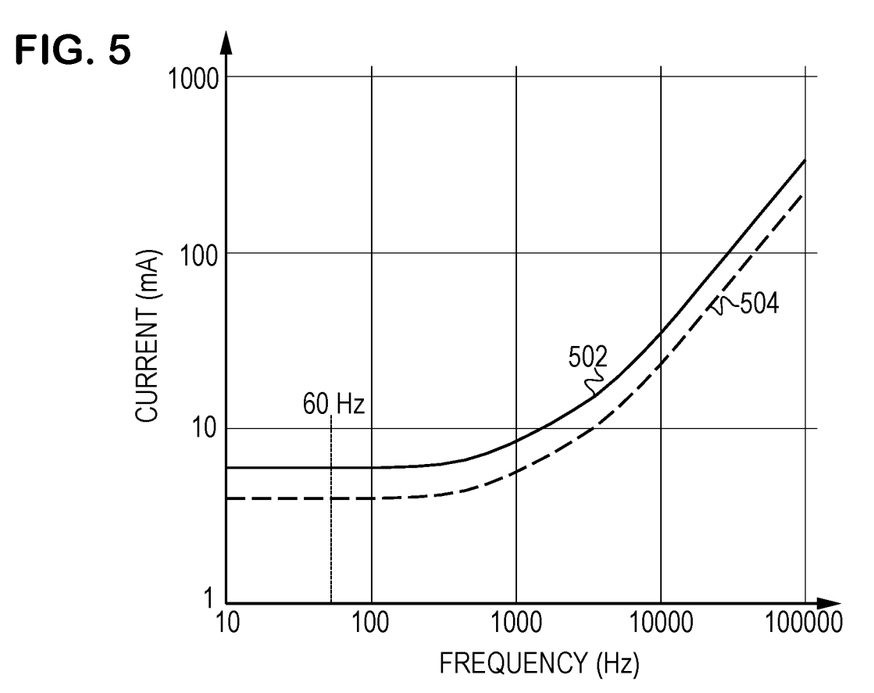
FIG. 5 is a graph of an illustrative frequency dependence.

Upstream of the DSP, the feedback impedance may be designed to provide a desired frequency dependence of the sensing amplifier's gain, such that the fixed threshold used by the DSP corresponds to a frequency-dependent current magnitude. If the current threshold is CT, the permitted leakage current CL may be expressed for one example implementation as $$C_L = C_T \left[ \frac{1754.5 + f}{1907} \right]$$

where the quantity in brackets is a frequency factor that is approximately unity at the mains frequency and increases with increasing frequency. This relationship is shown in FIG. 5. Curve 502 is the permitted leakage current when the threshold current is 6 mA, and curve 504 is the permitted leakage current when the threshold is 4 mA. Another way of expressing this relationship is that the sensing amplifier's magnitude gain function may be expressed with an inverse frequency dependence, e.g., as:

$$v = i \left( \frac{a}{b + f} \right)$$

where a and b are positive constants, f is frequency, and i is the signal current from the current transformer. The value of b is determined by what is determined to be a safe frequency dependence that provides sufficient protection for personnel while minimizing the risk of nuisance tripping. In some contemplated implementations, the value of b is about 1754.5. The sensing amplifier gain is determined by the feedback impedance and this feedback impedance can be designed to provide other frequency dependencies which may be determined to be safer or more suited to efficient feedback impedance implementation with discrete components.

Figure 6:
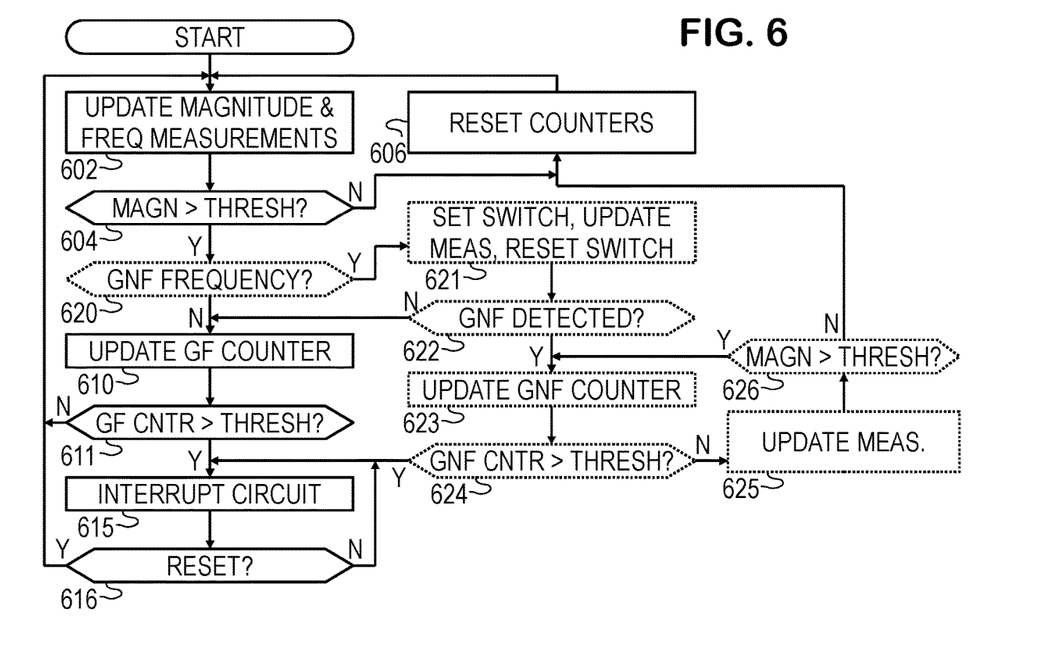
FIG. 6 is a flow diagram of an illustrative GFCI method.

FIG. 6 is a flow diagram of an illustrative GFCI method that may be implemented by the DSP. In block 602, the DSP updates the measurements derived from the digitized signal from the ADC. To recap, these measurements are obtained when the GFCI controller receives the signal current from the signal terminal of current transformer 402 and with the aid of the feedback impedance 406 converts the signal current into a frequency-dependent signal voltage that is then digitized by ADC. The DSP operates on the digitized signal sampled to determine a magnitude measurement. The magnitude may be obtained using the percentage measurement techniqued outlined above, or alternatively a root mean square calculation may be performed using, e.g., a nonlinear filter. Some implementations may count samples of a comparator output signal within a moving window or otherwise filter the comparator signal to determine a percentage value. Though the magnitude is obtained in a frequency independent and phase independent fashion by the DSP, the magnitude measurement may incorporate an implicit frequency dependence due to the frequency factor implemented by the analog sensing circuitry.

The measurements may further include a measurement of the signal frequency, which in some implementations may be measured by the DSP counting samples between positive-going zero crossings.

In block 604, the DSP determines whether the magnitude exceeds the predetermined fixed threshold (i.e., a threshold independent of signal frequency and phase). If not, the DSP may return to block 602 after resetting any verification and delay counters and/or timers in block 606. Otherwise, a delay timer may be initiated, and in optional block 620, the DSP determines whether the signal voltage frequency is in a predetermined frequency range representative of a Ground Neutral Fault, e.g., about 2 kHz to about 7 kHz. (Note that optional blocks 620-626 would only be implemented in GFCI devices having a second current transformer.) If not, or if a Ground Neutral Fault is otherwise ruled out as described below, the DSP updates a Ground Fault verification counter in block 610 and determines in bock 611 whether the verification counter exceeds a verification threshold, e.g., 2 or 3 contiguous detections. The verification threshold may be chosen to screen out electromagnetic interference and other transient events.

If the verification threshold is not met, the DSP returns to block 602. Otherwise, i.e., when the magnitude measurement exceeds the threshold for a predetermined number of times or for a predetermined period of time, in block 615 the DSP energizes the solenoid to interrupt the leakage current by disconnecting the load conductors. The DSP remains in the interrupt state until a reset is performed in block 616.

If in block 620, the leakage current frequency (and hence the signal voltage frequency) is determined to be in the predetermined frequency range representative of a Ground Neutral Fault frequency range, the DSP enables amplifier A3 to perform a Ground Fault Neutral test in block 621. An illustrative procedure for such testing is set forth in U.S. Pat. No. 11,411,388, titled "Fault Detection Circuit and Related Methods" and filed 2020 Aug. 7 by inventors Rishi P. Singh and Riley Beck, the entirety of which is hereby incorporated herein by reference. In at least some implementations, the testing may be performed by setting the switch to enable amplifier A3 and monitoring for oscillation of the amplifier output before resetting the switch. In some implementations, the testing procedure may be repeated to verify the detection of a Ground Neutral Fault. If the oscillation is detected when amplifier A3 is enabled, the test is indicative of a Ground Neutral Fault. If no such fault is detected in block 622, the DSP returns to block 610. Otherwise, in block 623 the DSP updates the Ground Neutral Fault verification counter. In block 624, the DSP determines whether the verification counter exceeds a predetermined verification threshold, and if not, updates the measurements in block 625. Once the verification threshold is reached, the DSP interrupts the circuit in block 615 as previously described. Otherwise, the measurements are updated in block 625. In block 626, the DSP determines whether the leakage current magnitude exceeds the threshold, returning to block 623 if so, and otherwise proceeding to block 606.

Though for ease of understanding the method of FIG. 6 has been illustrated and described as sequential steps, the operations of the various blocks can be implemented by pipelined or parallel hardware components enabling the operations to be performed concurrently and/or asynchronously.

In at least some embodiments, the proposed solution prevents the nuisance tripping of the device (primarily GFCI applications) due to higher frequency Ground Fault leakage currents at weighted RMS level that pose minimal risk to personnel. Such high frequency leakage currents are becoming increasingly common due to high efficiency appliances coupling higher frequency signals to ground. This solution may also provide a working implementation for the accurate detection of high frequency leakage currents at potentially harmful weighted RMS levels and trip the device. This solution may, in some embodiments, also distinguish between the Ground Neutral Fault dormant oscillations and high frequency Ground Faults even where their frequency bands overlap, accurately detecting and maintaining the appropriate responses to each applicable fault.

The invention claimed is:

1. A circuit that comprises:
   a current-to-voltage converter configured to receive a signal current from a first current transformer that senses a net current through multiple power conductors, the current-to-voltage converter configured to convert the signal current to a signal voltage, the signal voltage having a magnitude that decreases as frequency increases;
   an analog to digital converter configured to provide samples of the signal voltage; and
   a controller configured to interrupt at least one of the multiple power conductors when a magnitude measurement derived from the samples exceeds a frequency-independent and/or phase-independent threshold for a predetermined time period or for a predetermined number of times.

2. The circuit of claim 1, wherein the signal voltage is representable as $$v = i\left(\frac{a}{b+f}\right)$$

where a and b are positive constants, f is frequency, and i is the signal current.

3. The circuit of claim 2, wherein b has a value of about 1754.5.

4. The circuit of claim 1, wherein the magnitude measurement is based on a percentage of time that the samples exceed a baseline value.

5. The circuit of claim 1, wherein as part of interrupting the at least one of the multiple power conductors, the controller is configured to provide a pre-interrupt delay that depends on the magnitude measurement.

6. The circuit of claim 1, wherein the current-to-voltage converter is a first operational amplifier, and wherein the circuit further comprises: a second operational amplifier configured to couple to a bias terminal of the first current transformer and configured to eliminate any DC voltage difference between the bias terminal and a signal terminal of the first current transformer.

7. The circuit of claim 6, wherein the second operational amplifier is configured as a chopper amplifier.

8. The circuit of claim 1, further comprising:
   a third operational amplifier configured to couple to a second current transformer to induce an opposing current relative to the first current transformer,
   the controller configured to enable the third operational amplifier to test for a ground neutral fault when a signal voltage frequency is within a predetermined range.

9. A method that comprises:
   receiving a signal current from a current transformer configured to sense a net current through multiple power conductors;

converting the signal current into a frequency-dependent signal voltage, the frequency-dependent signal voltage being smaller for higher frequencies than for lower frequencies;

deriving a magnitude measurement from the signal voltage; and interrupting at least one of the multiple power conductors when the magnitude measurement exceeds a frequency-independent and/or phase-independent threshold for a predetermined period of time or a predetermined number of times.

10. The method of claim 9, wherein the signal voltage is representable as $$v = i\left(\frac{a}{b+f}\right)$$

where a and b are positive constants, f is frequency, and i is the signal current.

11. The method of claim 10, wherein b has a value of about 1754.5.

12. The method of claim 9, wherein said deriving the magnitude measurement includes: measuring a percentage of time that the signal voltage exceeds a baseline value.

13. The method of claim 9, wherein said interrupting at least one of the multiple power conductors includes providing a pre-interrupt delay that depends on the magnitude measurement.

14. The method of claim 9, further comprising biasing the current transformer with a chopper amplifier.

15. The method of claim 9, further comprising: testing for a ground neutral fault if the signal voltage has a frequency within a predetermined range, said interrupting at least one of the multiple power conductors being performed based on whether a ground neutral fault is detected.

16. A circuit that comprises:

an operational amplifier having an inverting input coupled to a current transformer configured to sense a net current through multiple power conductors, the operational amplifier having an output coupled to the inverting input via a feedback impedance that decreases with frequency;

a comparator configured to produce a comparator signal indicating when the output of the operational amplifier exceeds a frequency-independent value;

a controller configured to compare measure a percentage of time that the comparator signal is asserted, the percentage measurement representing a magnitude of the output of the operational amplifier, the controller further configured to assert an interrupt signal when the percentage measurement indicates a ground fault; and a relay configured to interrupt at least one of the multiple power conductors when the interrupt signal is asserted.

17. The circuit of claim 16, wherein the feedback impedance is representable as $$Z = \frac{a}{b+f},$$

where a and b are positive constants and f is frequency.

18. The circuit of claim 16, wherein the controller is configured to provide a pre-interrupt delay that depends on the percentage measurement.

19. The circuit of claim 16, wherein the controller is configured to test for a ground neutral fault using a third operational amplifier configured to couple to a second current transformer to induce an opposing current relative to the first current transformer which will produce an oscillating signal at the output of the third operational amplifier, and is configured to interrupt at least one of the multiple power conductors if the oscillating signal has a frequency within a predetermined range.

* * * * *